United States Patent
Li

(10) Patent No.: US 7,308,666 B1
(45) Date of Patent: Dec. 11, 2007

(54) METHOD AND AN APPARATUS TO IMPROVE HIERARCHICAL DESIGN IMPLEMENTATION

(75) Inventor: Hung-Chun Li, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 255 days.

(21) Appl. No.: 11/015,983

(22) Filed: Dec. 16, 2004

(51) Int. Cl.
*G06F 17/50* (2006.01)

(52) U.S. Cl. .................. 716/7; 716/2; 716/18; 716/13; 716/14

(58) Field of Classification Search .............. 716/7, 716/2, 18, 13, 14
See application file for complete search history.

(56) References Cited

U.S. PATENT DOCUMENTS

| | | | | |
|---|---|---|---|---|
| 5,452,239 A * | 9/1995 | Dai et al. | .................. | 703/19 |
| 5,550,748 A * | 8/1996 | Xiong | .................. | 716/13 |
| 5,648,911 A * | 7/1997 | Grodstein et al. | .................. | 716/18 |
| 5,694,328 A * | 12/1997 | Hayashi et al. | .................. | 716/9 |
| 5,729,466 A * | 3/1998 | Bamji | .................. | 716/10 |
| 5,838,583 A * | 11/1998 | Varadarajan et al. | .................. | 716/9 |
| 6,253,356 B1 * | 6/2001 | Kung | .................. | 716/5 |
| 6,405,345 B1 * | 6/2002 | Ginetti | .................. | 716/2 |
| 6,519,743 B1 * | 2/2003 | Nauts et al. | .................. | 716/3 |
| 6,529,861 B1 * | 3/2003 | Patra et al. | .................. | 703/14 |
| 6,763,506 B1 * | 7/2004 | Betz et al. | .................. | 716/6 |
| 7,080,334 B2 * | 7/2006 | Fan et al. | .................. | 716/6 |
| 7,203,914 B2 * | 4/2007 | Wood | .................. | 716/4 |
| 2002/0023252 A1 * | 2/2002 | Lee et al. | .................. | 716/6 |
| 2003/0046650 A1 * | 3/2003 | Tanaka | .................. | 716/12 |
| 2005/0251775 A1 * | 11/2005 | Wood | .................. | 716/10 |
| 2006/0101365 A1 * | 5/2006 | Ho et al. | .................. | 716/7 |

FOREIGN PATENT DOCUMENTS

JP     2000259701 A  *  9/2000

OTHER PUBLICATIONS

Fang et al., "Performance-driven Multi-FPGA Partitioning Using Functional Clustering and Replication", 1998 Proceedings of Design Automation Conference, Jun. 15-19, 1998, pp. 283-286.*
Beraudo et al., "Timing Optimization of FPGA Placements by Logic Replication", 2003 Proceedings of Design Automation Conference, Jun. 2-6, 2003, pp. 196-201.*
"Hierarchical Static Timing Analysis Using Interface Logic Models," Jan. 2001, Synopsys Inc., 10 pages.

* cited by examiner

Primary Examiner—Phallaka Kik
(74) *Attorney, Agent, or Firm*—Orion Law Group, Plc.; William E. Alford; Chui-Kui Teresa Wong

(57) ABSTRACT

A method and an apparatus to improve hierarchical design implementation have been disclosed. In one embodiment, the method includes deriving boundary logic of at least one of a plurality of partitions in an integrated circuit (IC) design, marking the boundary logic of the at least one of the plurality of partitions based on at least one predetermined criterion, and performing implementation of the IC design using the marked boundary logic.

35 Claims, 9 Drawing Sheets

(BACKGROUND)

(BACKGROUND)

METHOD AND AN APPARATUS TO IMPROVE HIERARCHICAL DESIGN IMPLEMENTATION

FIELD OF INVENTION

The present invention relates to hierarchical design implementation, and more particularly, to using boundary logic marking to improving hierarchical design implementation.

BACKGROUND

Generally speaking, implementation is performed on the entire integrated circuit (IC) design in a typical IC design flow to turn a logical representation of the design into a physical representation of the design. In the current document, the entire design of a semiconductor IC is referred to as a full-chip design. Boundary can be defined within the full-chip design to divide the full-chip design into a number of regions, each containing a set of circuit objects (which are simply referred to as objects hereinafter). When these regions are still logically connected to each other in the full-chip design, these regions are referred to as partitions of the full-chip design. But when these regions are logically separated or cut from each other such that each region becomes an individual entity, each of these regions is referred to as a block.

A flow diagram describing one conventional process to implement a full-chip design is illustrated in FIG. 1A. Note that the conventional process in FIG. 1A may be referred to as a top-down design approach. At processing block 110, the full-chip design is read in. Then the full-chip design is flattened in processing block 120. At processing block 130, the boundary of a set of partitions in the full-chip design is defined.

After defining the boundary, full-chip placement, routing, timing analysis, and optimization are performed on the full-chip design at processing block 140. In other words, the above operations are performed on a variety of objects (e.g., pins, ports, cells, nets, clocks, etc.) in each of the partition in the full-chip design. Then the design is cut into blocks at the boundary at processing block 150 to derive block constraints and pin assignment. The cutting of the full-chip design into blocks may be referred to as partitioning. Each of the blocks is a separate individual entity. Using the results from processing blocks 140 and 150, timing models of the blocks can be created. These models of the blocks may be merged or integrated to generate a new top view of the full-chip design. Integration of the models of the blocks is possible if the implementation of each block can meet the block constraints derived during the cutting at processing block 150.

However, the conventional process described above usually takes a long time to run. The processing time increases as the size and complexity of the IC design grows. Given that design netlists today are approaching fifty million instances, processing time has become an increasingly more important issue in IC design flow. In particular, timing analysis typically takes longer to run than other operations performed during full-chip implementation (e.g., placement, routing, optimization, etc.). In general, all objects in the partitions of the full-chip design are processed to create the timing models for the timing analysis. However, it is unnecessary to process many of the objects in order to provide accurate timing analysis. Therefore, much of the processing time and memory capacity have been wasted in processing all objects in the partitions of the full-chip design.

In order to improve the speed of design implementation and to reduce the memory capacity required, some techniques have been developed. One such conventional technique is to cut the full-chip design into blocks, derive Interface Logic Models (ILMs) of the blocks, and perform timing analysis on the ILMs. FIG. 1B illustrates a flow diagram of one conventional process to derive an ILM for a block.

Referring to FIG. 1B, the internal timing on the block is verified at processing block 160. By ensuring that the internal register-to-register paths on the block meet timing requirements over a narrow timing range for global chip-level signals, such as clocks, reset, scan enable, etc., the verification results for the internals of the block are valid as long as these global chip-level signals conform to their expected timing.

At processing block 165, the interface logic of the block is identified based on the connectivity of the objects in the block. According to one conventional approach, three types of objects are identified to be the interface logic of a block. First, all objects contained in timing paths leading from input ports to either an edge-triggered register or output ports at which these paths terminate are identified as interface logic. Second, all objects contained in timing paths leading to output ports from either edge-triggered registers or input ports at which these paths originate are also identified as interface logic. Third, the clock tree that drives interface registers is identified as interface logic as well.

After identifying the interface logic of the block, a netlist is written for the ILM of the block at processing block 170. Note that the ILM netlist includes only the identified interface logic. Objects not identified as interface logic at processing block 165 (also referred to as the internal logic or the core logic of the block) are not included in the ILM netlist. The unidentified objects are removed (also referred to as trimmed). As a result, the ILM derived contains fewer objects than the original block. According to one conventional approach, a flattened Verilog netlist is generated for the ILM. The flattened Verilog netlist does not preserve any of the original design hierarchy.

At processing block 175, the ILM constraints are written. The ILM constraints include assertions and exceptions that apply to the objects that belong to the ILM. Note that the ILM constraints may be flattened if the ILM netlist is also flattened.

Finally, ILM back-annotation files are written at processing block 180. In general, the back-annotation file associates some or all of the objects within the block with their corresponding resistive and capacitive parameters. The back-annotation files written may contain only information for the pins and nets that belong to the ILM.

Timing analysis is then performed on the ILM generated. Since the ILM contains significantly fewer objects than the original block does, timing analysis can be performed faster on the ILM than on the original block, and hence, reducing the time it takes to run full-chip implementation. However, one drawback of the approach using the ILM is that the ILMs cannot be merged back for other operations performed during full-chip implementation (e.g., placement, routing, optimization, etc.) because the internal logic of the blocks have already been removed from the ILMs of the blocks. In general, many operations of the full-chip implementation are performed on both the interface logic and the internal logic of the blocks. Thus, the ILMs are essentially useful only for timing analysis in the typical full-chip implementation process.

SUMMARY

In one embodiment, the present invention includes a method and an apparatus to improve hierarchical design implementation. In one embodiment, the method includes deriving boundary logic of at least one of a plurality of partitions in an integrated circuit (IC) design, marking the boundary logic of the at least one of the plurality of partitions based on at least one predetermined criterion, and performing implementation of the IC design using the marked boundary logic.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and an apparatus to improve hierarchical design implementation are described. In the following description, numerous specific details are set forth. However, it is understood that embodiments of the invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1A:
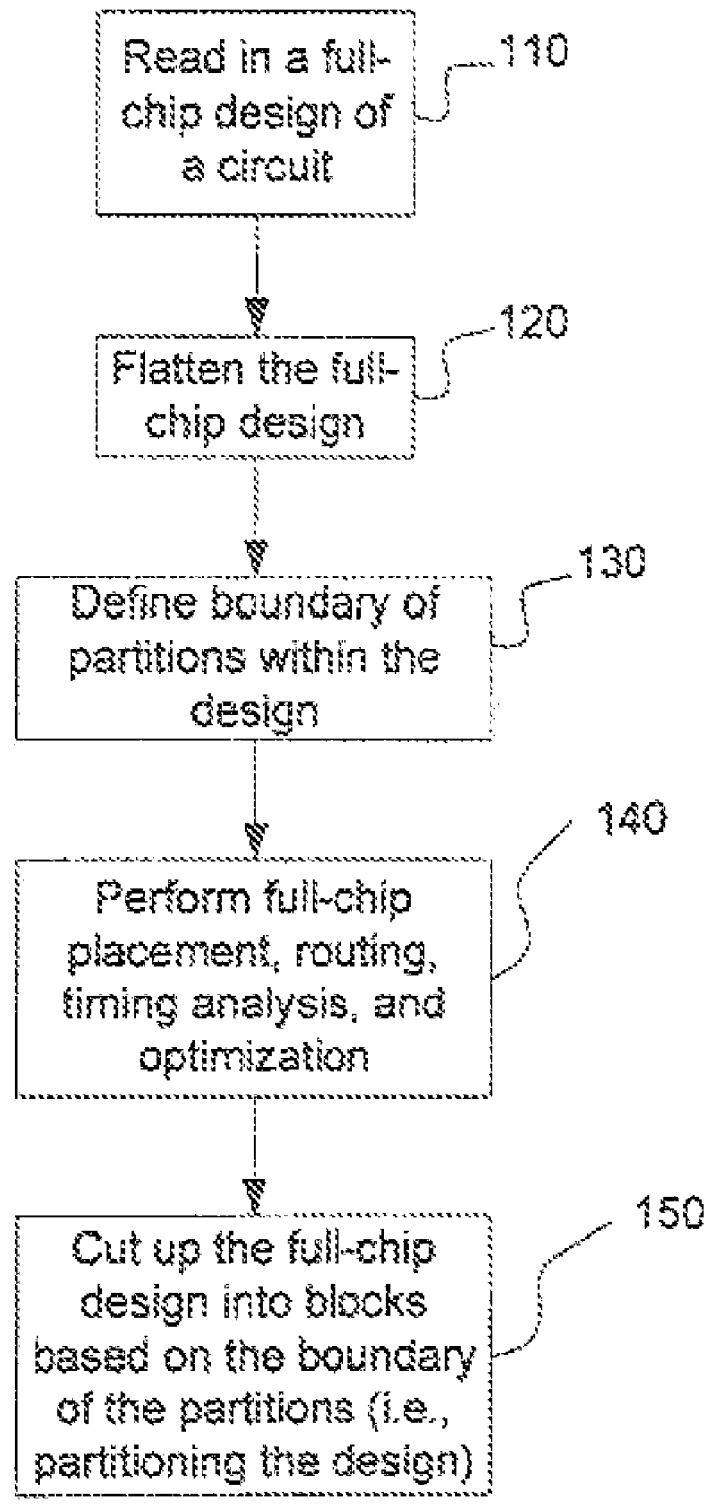
FIG. 1A illustrates a flow diagram of one conventional process to perform hierarchical design implementation.
Figure 1B:
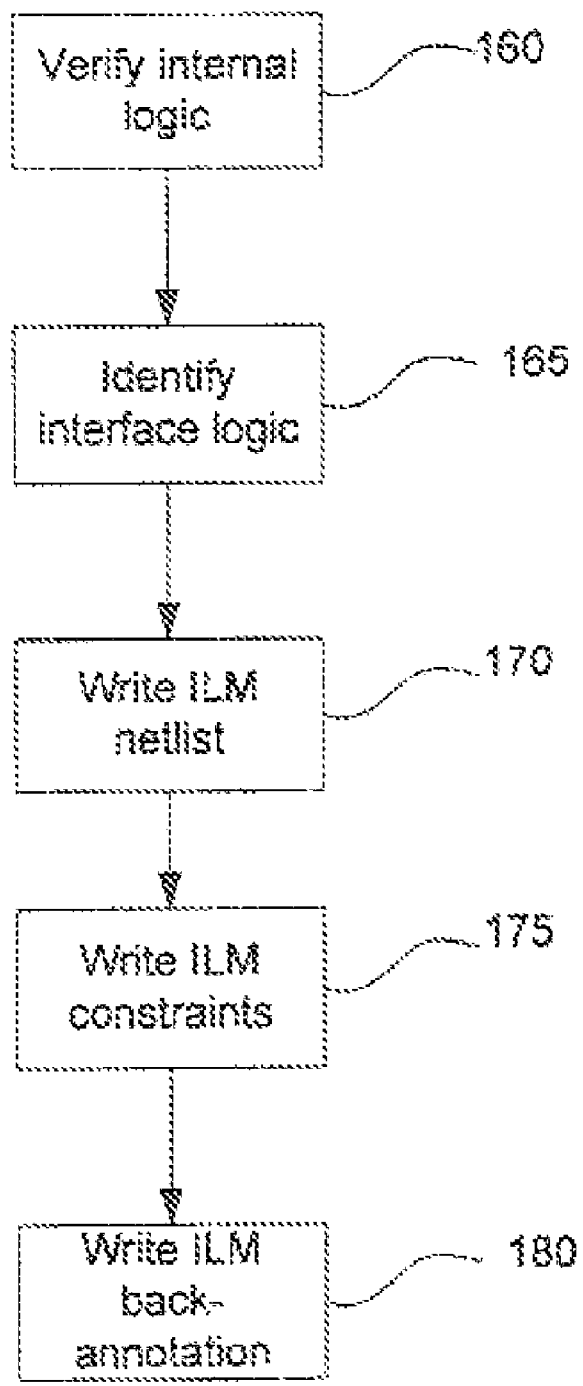
FIG. 1B illustrates a flow diagram of one conventional process to derive an ILM of a block.
Figure 2A:
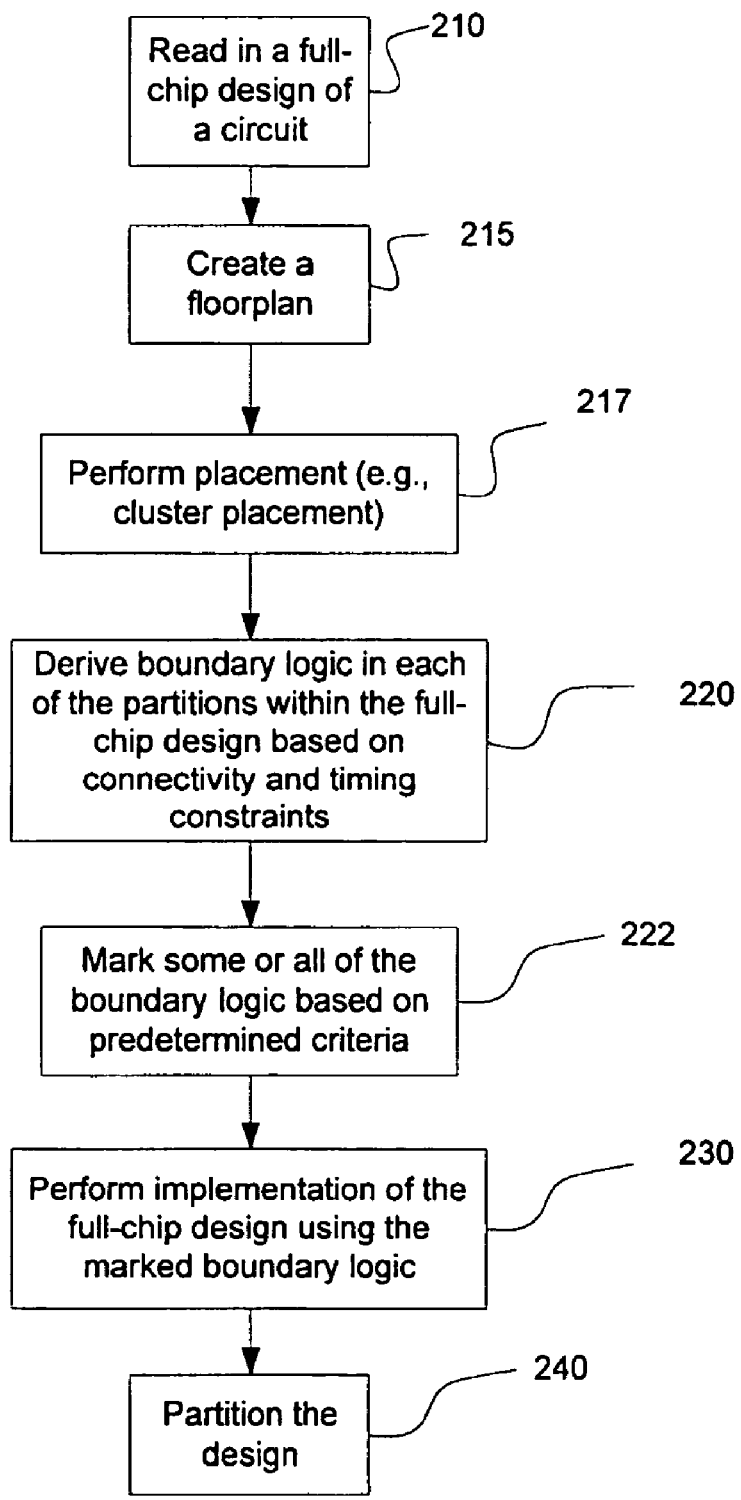
FIG. 2A illustrates a flow diagram of one embodiment of a design process using boundary logic marking.

FIG. 2A shows a flow diagram of one embodiment of a design process using boundary logic marking. Note that this process may be referred to as a top-down design approach. The process may be performed by processing logic that may comprise hardware (e.g., circuitry, dedicated logic, etc.), software (such as an electronic design automation (EDA) tool, operable to run on a general-purpose computer system or a dedicated machine), or a combination of both.

Figure 3A:
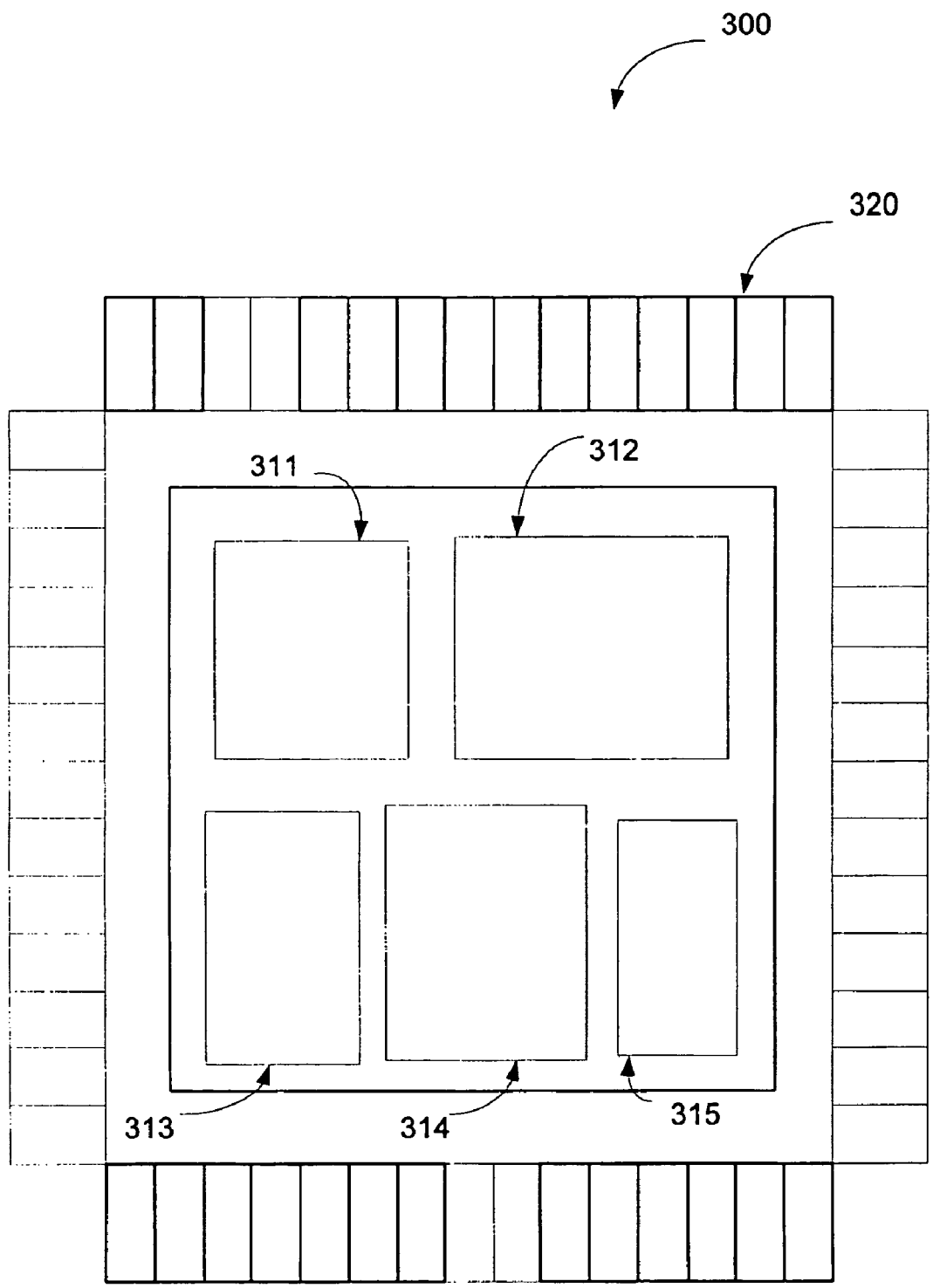
FIG. 3A shows an exemplary embodiment of a floorplan of a sample semiconductor chip design.

Initially, processing logic reads in data of a full-chip IC design (processing block 210). Then processing logic creates a floorplan of the design based on the data read in (processing block 215). The floorplan may be referred to as the top view of the design. The floorplan is a high-level representation of the design showing where the major functional blocks in the design are to be physically placed on a silicon chip. A sample of the floorplan with five blocks is shown in FIG. 3A. The top design 300 includes five blocks 311-315 and a number of pins 320. Then processing logic performs placement (such as cluster placement) using the floorplan (processing block 217). Placement involves determining the optimum location for individual objects (e.g., logic gates) in the design. In some embodiments, processing logic performs a cluster placement by grouping a number of objects (e.g., about ten to twenty objects) into a cluster and then placing the clusters.

In one embodiment, processing logic derives the boundary logic of the partitions (processing block 220). In one embodiment, boundary logic includes some or all of the interface logic of the partitions, subject to timing constraints as applied to the partitions. As mentioned above, interface logic may include the objects contained in timing paths leading from input ports to either an edge-triggered register or output ports at which these paths terminate, the objects contained in timing paths leading to output ports from either edge-triggered registers or input ports at which these paths originate, and the clock tree that drives interface registers, etc.

There are various ways to derive the boundary logic of a partition. One embodiment of a process to derive the boundary logic of a partition is shown in details in FIG. 2B to illustrate the concept. Again, like the process shown in FIG. 2A, the process shown in FIG. 2B is performed by processing logic that may comprise hardware (e.g., circuitry, dedicated logic, etc.), software (such as an EDA tool, operable to run on a general-purpose computer system or a dedicated machine), or a combination of both.

Figure 2B:
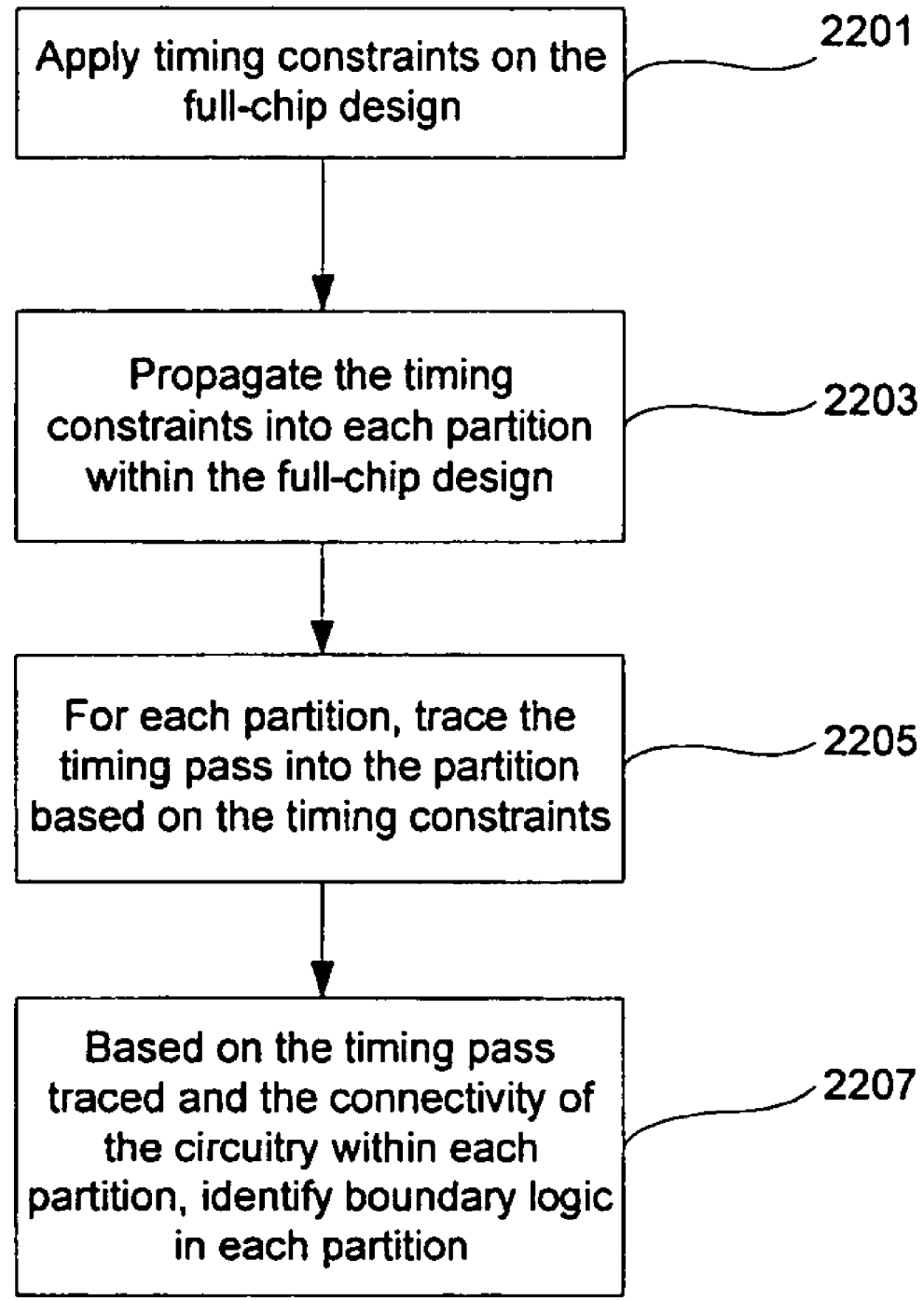
FIG. 2B illustrates a flow diagram of one embodiment of process to derive boundary logic.

Referring to FIG. 2B, processing logic applies timing constraints on the full chip design (processing block 2201). Then processing logic propagates the timing constraints into each partition within the full-chip design (processing block 2203). For each of the partitions, processing logic traces the timing pass into the partition based on the timing constraints (processing block 2205).

Based on the timing pass traced and the connectivity of the objects within each partition, processing logic identifies the boundary logic of each partition (processing block 2207). For example, if a gate is identified to be a possible part of the boundary logic of a partition based on the connectivity of the gate within the partition, then processing logic checks the timing constraints as applied to the partition to determine if this gate will be useful in the timing analysis of the partition. For instance, if the gate is not along the timing pass traced, then the gate may not be useful in the timing analysis of the partition. If the gate is determined to be useful in timing analysis, the gate is identified as part of the boundary logic. Otherwise, the gate is not identified as part of the boundary logic.

Referring back to FIG. 2A, after deriving the boundary logic in the partitions, processing logic marks at least part of the boundary logic of each partition based on some predetermined criteria (processing block 222). To mark a part of the boundary logic of a partition is to make the part visible to one or more processing engines (e.g., timing engine) of the EDA tool and to make the rest of the partition invisible to the processing engines. Unlike the conventional technique discussed above, which removes the internal logic and keeps the interface logic identified, processing logic merely makes the unmarked portion of the partition invisible to the processing engines without removing the unmarked portion of the partition. The data of the unmarked portion of the partition remains in the database that stores the data of the partition.

There are various ways to mark the boundary logic of a block. For example, suppose processing logic is going to mark an object within the boundary logic of a block. In some embodiments, processing logic sets a flag of the object to indicate to the processing engines that the object is not to be ignored by the processing engines. For instance, the flag of the object may be set to "1" to indicate that the object is not to be ignored by the processing engines and the flag may be set to "0" to indicate that the object is to be ignored by the processing engines. By causing the processing engines not to ignore the object, the object becomes visible to the processing engines. Likewise, causing the processing engines to ignore the object makes the object invisible to the processing engines.

Figure 3B:
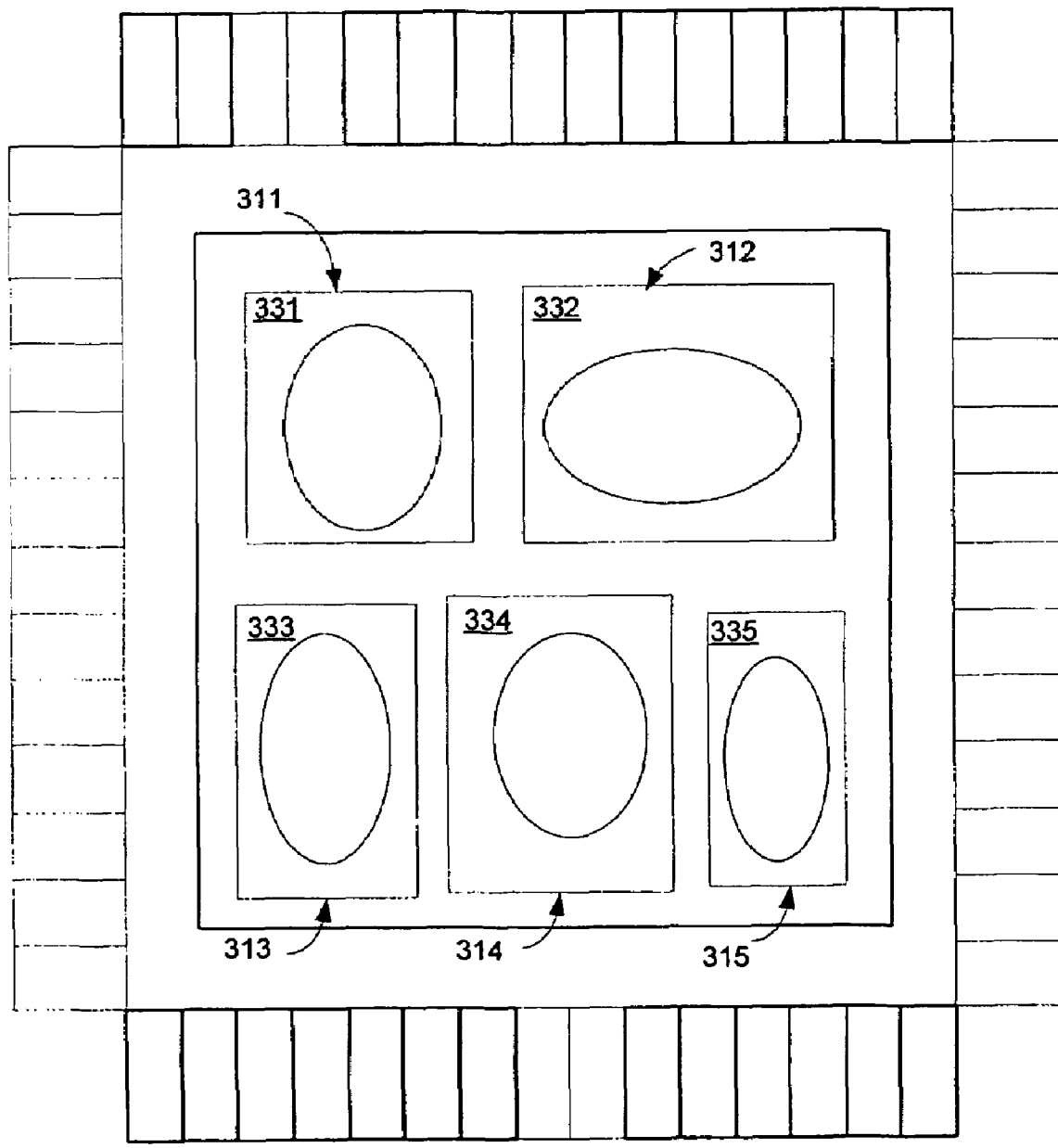
FIG. 3B shows one embodiment of a top view of a design with marked boundary logic.

FIG. 3B shows one embodiment of a top design with boundary logic marked. For each of the partitions 311-315, their corresponding boundary logic 331-335 is marked. Therefore, processing engines do not ignore the marked boundary logic 331-335 when performing design operations (e.g., analysis, optimization, etc.) on the partitions 311-315, while ignoring the unmarked portions of the partitions 311-315.

Note that fewer objects in a partition remain visible when the boundary logic of the partition is marked. Therefore, processing engines that process the partition have to process fewer objects when the boundary logic of the partition is marked. As a result, it is generally faster to analyze a partition having marked boundary logic than to analyze a partition whose boundary logic is not marked. For the above reason, less memory capacity may be required to analyze a partition having marked boundary logic than to analyze a partition whose boundary logic is not marked as well. However, the improvement in both the processing speed and the memory capacity may be achieved at the expense of the accuracy since not all objects within the partition is evaluated. As the desired levels of accuracy, processing speed, and memory capacity may vary in different situations, the boundary logic of the partitions in a design may be marked in a variety of ways to better accommodate the situation.

In one embodiment, processing logic simply marks all boundary logic of every partition in the full-chip design, such as illustrated in the design in FIG. 3B. This strategy is relatively simple and saves significant processing time because the processing engines of the EDA tool process only the marked boundary logic.

In an alternative embodiment, processing logic marks the boundary logic of only a subset of the partitions in the design. For example, if it is desired to focus on a particular partition, Partition A, in the full-chip design, processing logic may preserve Partition A and mark the rest of the partitions in the full-chip design. By preserving Partition A, all objects within Partition A remain visible to the processing engines, and hence, all objects within Partition A are not to be ignored by the processing engines. Consequently, the result generated by the processing engines on Partition A is likely to be more accurate. Furthermore, since the rest of the partitions are not the focus of the current example, processing time can be saved by marking the boundary logic of the rest of the partitions to cause the processing engines to ignore the internal logic of these partitions.

Figure 3C:
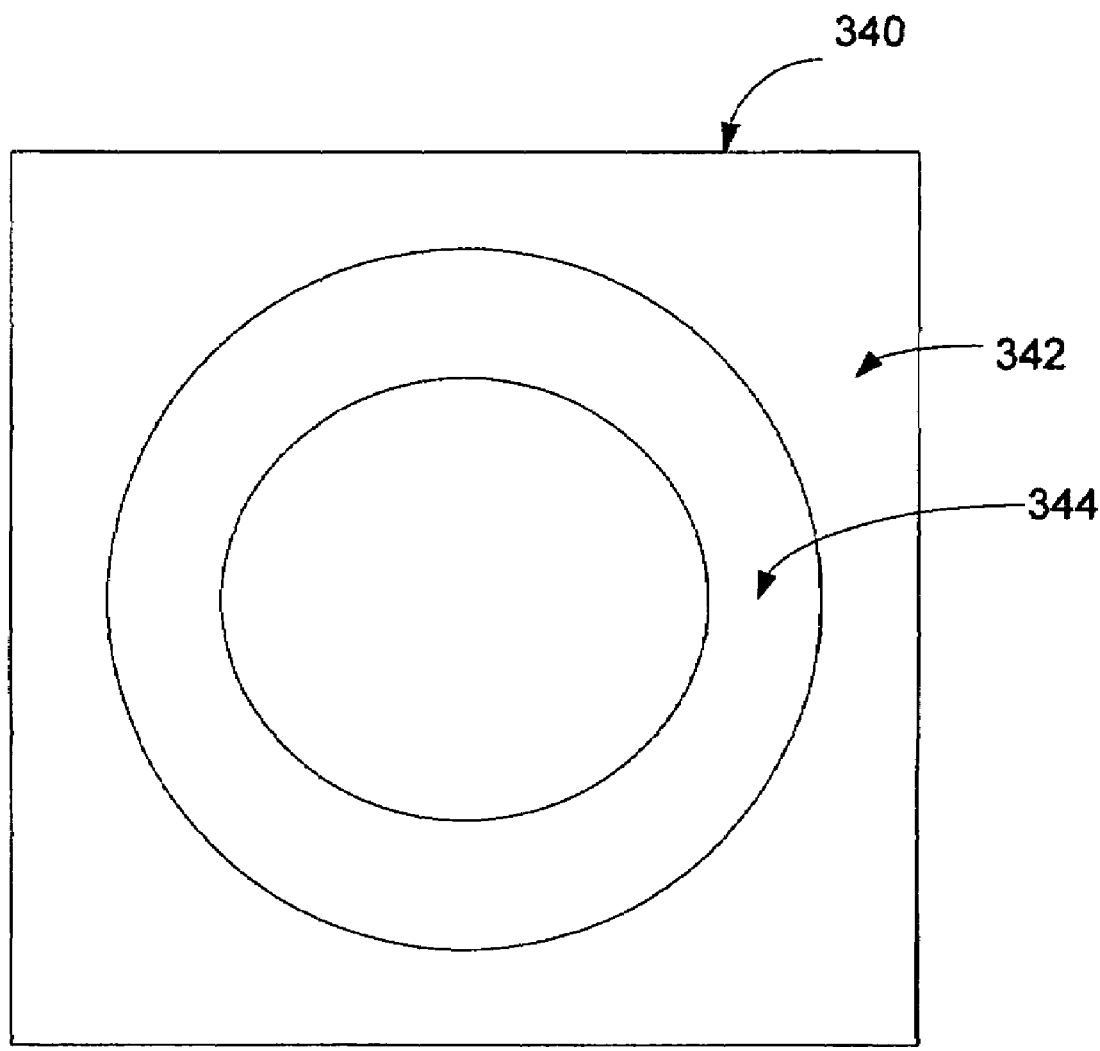
FIG. 3C shows an exemplary embodiment of a partition having boundary logic marked in two different levels.

Furthermore, processing logic may mark different parts of the boundary logic within a partition in different levels based on how timing-critical the corresponding part of the boundary logic is. For instance, the most timing-critical part of the boundary logic may be marked as level 1, and the less timing-critical part of the boundary logic may be marked as level 2. Of course, it should be appreciated that the boundary logic may be marked in more than two levels in different embodiments. FIG. 3C shows an exemplary embodiment of a partition 340 whose boundary logic is marked in two different levels. The outer part of the boundary logic 342 is marked as level 1 and the inner part of the boundary logic 344 is marked as level 2 because the outer part 342 is more timing-critical than the inner part 344.

In an alternative embodiment, processing logic marks the boundary logic of a partition based on the type of objects within the partition. For example, the boundary logic in partitions containing asynchronous objects may or may not be marked. But the boundary logic in partitions containing synchronous objects are marked.

Furthermore, different additional criteria may be adopted based on the needs of circuit designers. Also, the chosen criteria may be modified by the circuit designers later as the needs of the circuit designers change.

In some embodiments, processing logic may copy the data of a partition to a temporary storage medium (e.g., the memory in a general-purpose computing system) and then proceed to derive the boundary logic of the partition and to mark some or all of the boundary logic of the partition. Then processing logic may replace the data of the partition with the data resulted from deriving and marking the boundary logic of the partition. Note that processing logic may not have to cut the partition from the rest of the full-chip design in order to derive the boundary logic of the partition.

Referring back to FIG. 2A, processing logic implements the full-chip design with some or all of the partitions within the full-chip design marked (processing block 230). Note that implementation performed in a quick and dirty manner in order to quickly produce a rough evaluation of the design may be referred to as prototyping. Prototyping is useful for providing a gating evaluation of the design early in the design flow. One should appreciate that the technique described in the current document may be applied to prototyping as well.

Figure 2C:
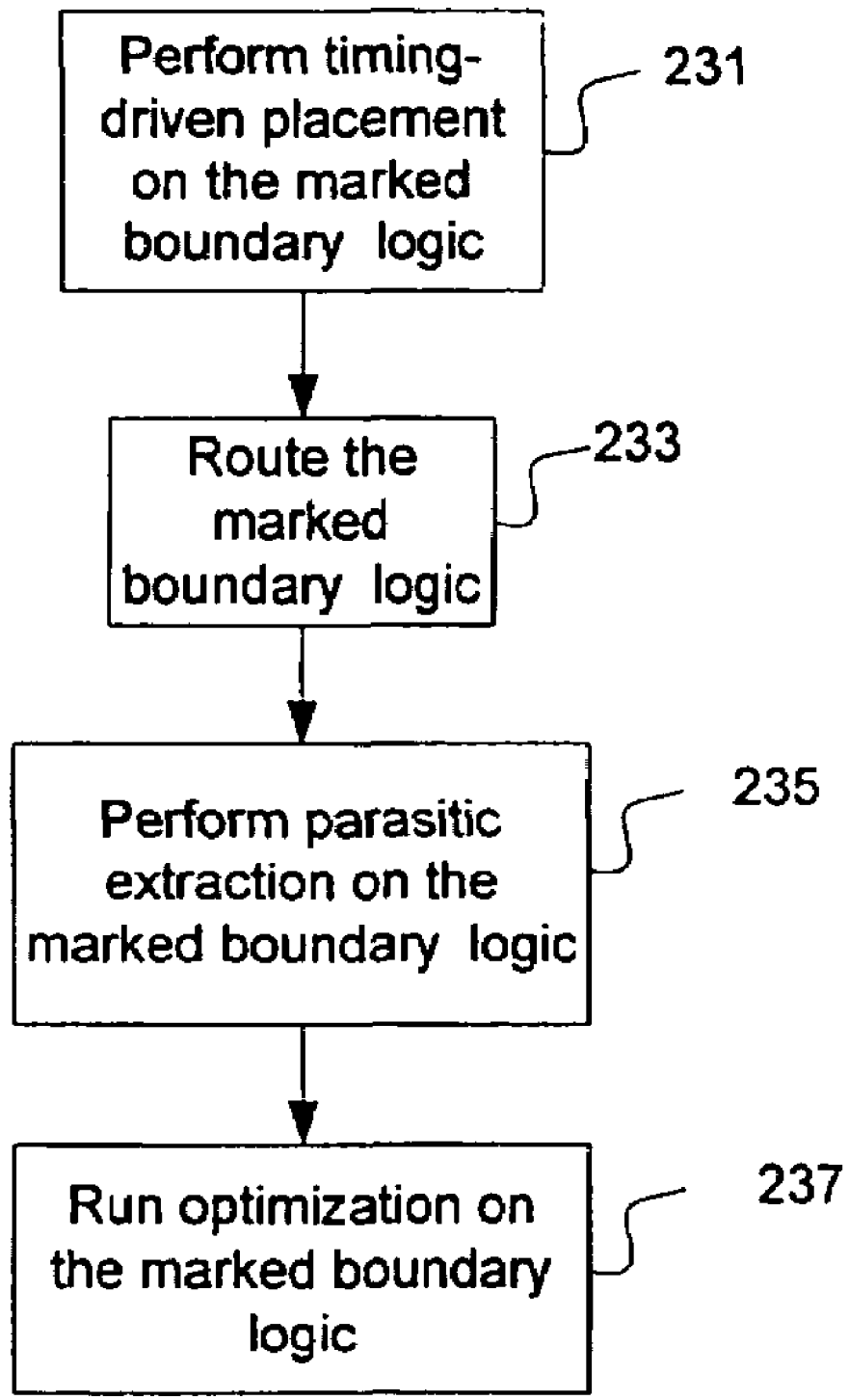
FIG. 2C illustrates a flow diagram of one embodiment of a process to perform implementation of a full-chip design using marked boundary logic.

Processing logic implements the full-chip design using the marked boundary logic in some or all of the partitions by performing various operations. One embodiment of such an implementation process is illustrated in FIG. 2C. Again, like the process shown in FIG. 2A, the process shown in FIG. 2C is performed by processing logic that may comprise hardware (e.g., circuitry, dedicated logic, etc.), software (such as an EDA tool, operable to run on a general-purpose computer system or a dedicated machine), or a combination of both.

Referring to FIG. 2C, processing logic performs timing-driven placement on the marked boundary logic of the partitions in the full-chip design (processing block 231). Processing logic routes the marked boundary logic of the partitions in the full-chip design (processing block 233). Processing logic performs timing analysis (e.g., parasitic extraction, delay characterization, etc.) on the marked boundary logic of the partitions in the full-chip design (processing block 235). Finally, processing logic performs optimization on the marked boundary logic of the partitions in the full-chip design (processing block 237). Note that these operations may or may not be performed in the particular order as described in FIG. 2C. Furthermore, different embodiments may include more or fewer operations to implement the full-chip design.

Referring back to FIG. 2A, processing logic cuts up the full-chip design into separate individual blocks at the boundary of the partitions after the implementation in processing block 230 (processing block 240). Note that the cutting up of the full-chip design into separate individual blocks may also be referred to as partitioning. In one embodiment, processing logic further derives a set of block constraints for the blocks and pin assignment for the full-chip design during the partitioning in processing block 240. Processing logic may further generate a new top view of the full-chip design based on the marked boundary logic, the set of block constraints, and the pin assignment. With the marked boundary logic frozen, processing logic may design the unmarked portion of each block after the partitioning in processing block 240 without affecting the top view generated.

Although the technique described above is illustrated using the implementation of a full-chip design, one should appreciate that the technique is also applicable to implement a portion of the design less than a full-chip. Furthermore, the various operations in the implementation may or may not be all performed on marked boundary logic. For example, placement may be performed on both the unmarked portion of the blocks as well as the marked boundary logic while optimization may be performed on only the marked boundary logic.

Unlike the conventional ILM described above, the blocks with marked boundary logic can be integrated or merged back into a full-chip design because the data of the unmarked portions of the blocks is still available in the database that stores the data of the blocks. As discussed above, the unmarked portions are merely made invisible to the processing engines of the EDA tool. The data of the unmarked portions are not removed or discarded. Therefore, the current technique is not only useful for speeding up timing analysis, but also for speeding up other operations of the full-chip implementation, such as placement, routing, optimization, etc.

Moreover, the technique described above provides numerous advantages over the conventional hierarchical design implementation, including improvements in speed and memory capacity requirement. By marking the boundary logic and processing only the marked boundary logic during the full-chip implementation, the complexity of the intra-partition paths and the volume of the routing data to be processed are reduced because only the marked boundary logic are routed. Furthermore, the speed of the implementation is improved because the timing-driven placement run time, the routing run time, and the timing analysis run time can be reduced as these operations are performed on only the marked boundary logic. Likewise, the memory capacity required to perform the full-chip implementation is also less than the memory capacity required by some conventional full-chip implementation because only the marked boundary logic is processed.

Figure 4:
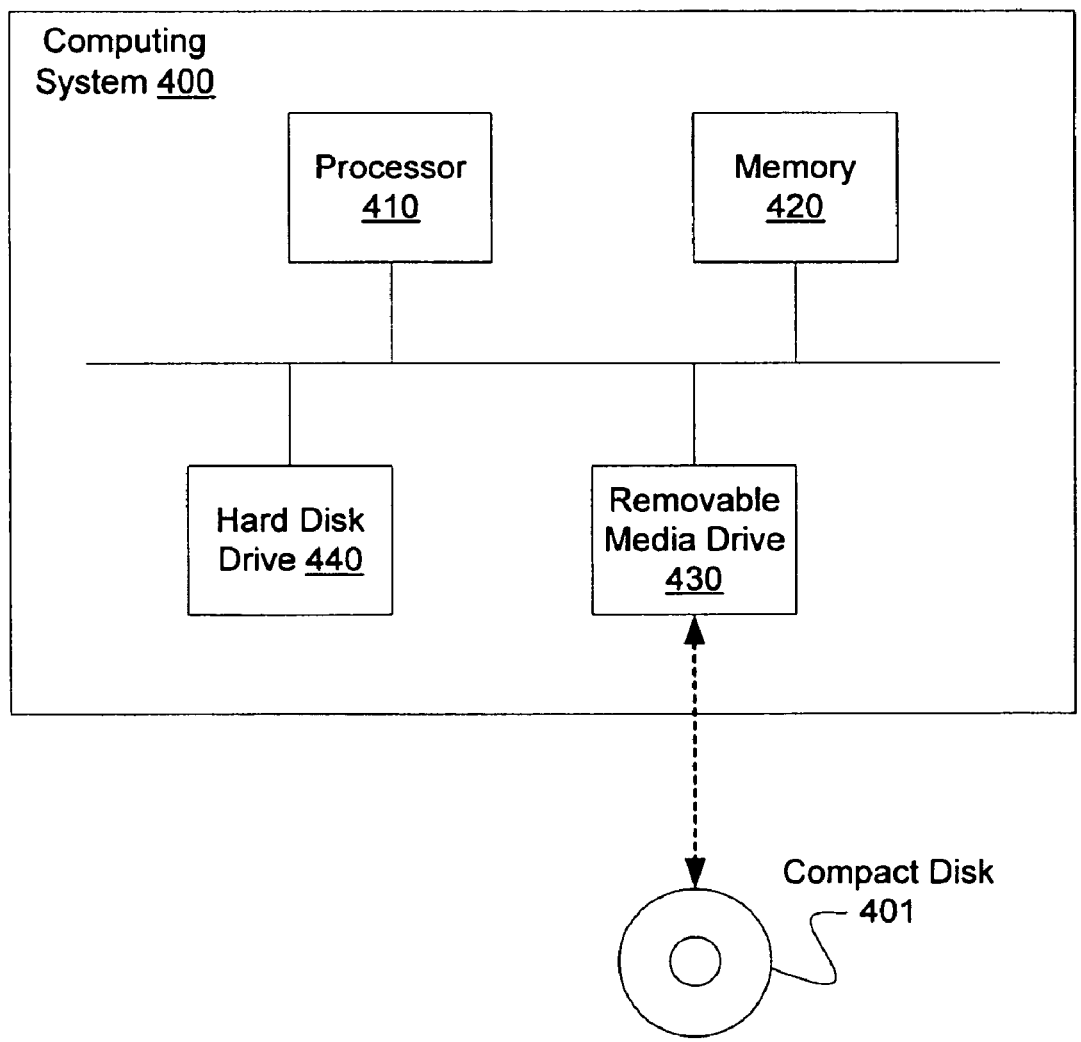
FIG. 4 illustrates an exemplary embodiment of a computing system usable with one embodiment of the present invention.

FIG. 4 illustrates a computing system that may be used to perform some or all of the processes according to one embodiment of the invention. In one embodiment, the computing system 400 includes a processor 410 and a memory 420, a removable media drive 430, and a hard disk drive 440. In one embodiment, the processor 410 executes instructions residing on a machine-readable medium, such as the hard disk drive 440, a movable medium (e.g., a compact disk 401, a magnetic tape, etc.), or a combination of both. The instructions may be loaded from the machine-readable medium into the memory 420, which may include Random Access Memory (RAM), dynamic RAM (DRAM), etc. The processor 410 may retrieve the instructions from the memory 420 and execute the instructions to perform the operations described above.

Note that any or all of the components and the associated hardware illustrated in FIG. 4 may be used in various embodiments of the system 400. However, it should be appreciated that other configurations of the system 400 may include more or fewer devices than those shown in FIG. 4.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons for common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations described herein. This apparatus may be specially constructed for the required purposes, or it may comprise a general-purpose computer selectively activated or reconfigured by a computer program stored in the computer. Such a computer program may be stored in a machine-readable medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the present intention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A method comprising:
deriving boundary logic of at least one partition of a plurality of partitions in an integrated circuit (IC) design in response to connectivity and timing constraints of the IC design;
marking the boundary logic of the at least one partition for design operations based on at least one predetermined criterion such that unmarked portions of the at least one partition are ignored during design operations of the IC design to save processing time; and
performing implementation of the IC design in response to the marking of the boundary logic.

2. The method of claim 1, wherein the deriving of the boundary logic of the at least one partition of the plurality of partitions includes
identifying the boundary logic in a corresponding partition based on connectivity of a plurality of objects within the corresponding partition and at least one timing constraint.

3. The method of claim 2, wherein the deriving of the boundary logic of the at least one partition of the plurality of partitions further includes
applying the at least one timing constraint on the IC design;
propagating the at least one timing constraint into the corresponding partition; and
tracing a timing pass into the corresponding partition based on the at least one timing constraint.

4. The method of claim 1, wherein the marking of the boundary logic of the at least one partition includes
marking the boundary logic in different levels based on timing of the boundary logic of a corresponding partition.

5. The method of claim 1, wherein the marking of the boundary logic of the at least one partition includes
marking the boundary logic based on a type of objects within a corresponding partition.

6. The method of claim 5, wherein the marking of the boundary logic based on the type of objects within the corresponding partition includes
marking the boundary logic of the corresponding partition if the corresponding partition includes at least one synchronous object.

7. The method of claim 1, wherein
the marking of the boundary logic forms marked boundary logic, and
the performing of the implementation of the IC design in response to the marking of the boundary logic includes
performing timing-driven placement of the IC design with the marked boundary logic;
routing the IC design with the marked boundary logic;
performing timing analysis of the IC design with the marked boundary logic; and
optimizing the IC design with the marked boundary logic after the performing of the timing-driven placement.

8. The method of claim 1, further comprising:
cutting the IC design into a plurality of blocks after the performing of the implementation of the IC design in response to the marking of the boundary logic.

9. The method of claim 1, wherein
the at least one predetermined criterion for marking the boundary logic is if the boundary logic includes at least one synchronous object.

10. The method of claim 1, wherein
the at least one predetermined criterion for marking the boundary logic is timing-criticality.

11. The method of claim 1, wherein
the design operations are one or more of timing analysis, logic optimization, circuit placement, and circuit routing.

12. A machine-readable medium that includes instructions that, when executed, will perform operations comprising:
deriving boundary logic of at least one partition of a plurality of partitions in an integrated circuit (IC) design in response to connectivity and timing constraints of the IC design;
marking the boundary logic of the at least one partition for design operations based on at least one predetermined criterion such that unmarked portions of the at least one partition are ignored during design operations of the IC design to save processing time; and
performing implementation of the IC design in response to the marking of the boundary logic.

13. The machine-readable medium of claim 12, wherein the deriving of the boundary logic of the at least one partition of the plurality of partitions includes
identifying the boundary logic in a corresponding partition based on connectivity of a plurality of objects within the corresponding partition and at least one timing constraint.

14. The machine-readable medium of claim 13, wherein the deriving of the boundary logic of the at least one partition of the plurality of partitions further includes
applying the at least one timing constraint on the IC design;
propagating the at least one timing constraint into the corresponding partition; and
tracing a timing pass into the corresponding partition based on the at least one timing constraint.

15. The machine-readable medium of claim 12, wherein the marking of the boundary logic of the at least one partition includes
marking the boundary logic in different levels based on timing of the boundary logic of a corresponding partition.

16. The machine-readable medium of claim 12, wherein the marking of the boundary logic of the at least one partition includes
marking the boundary logic based on a type of objects within a corresponding partition.

17. The machine-readable medium of claim 16, wherein the marking of the boundary logic based on the type of objects within the corresponding partition includes
marking the boundary logic of the corresponding partition if the corresponding partition includes at least one synchronous object.

18. The machine-readable medium of claim 12, wherein
the marking of the boundary logic forms marked boundary logic, and
the performing of the implementation of the IC design in response to the marking of the boundary logic includes
performing timing-driven placement of the IC design with the marked boundary logic;
routing the IC design with the marked boundary logic;
performing timing analysis of the IC design with the marked boundary logic; and optimizing the IC design with the marked boundary logic after the performing of the timing-driven placement.

19. The machine-readable medium of claim 12, wherein the operations further include
cutting the IC design into a plurality of blocks after the performing of the implementation of the IC design in response to the marking of the boundary logic.

20. A system comprising:
a processor; and
a memory to store instructions when executed will perform operations including
deriving boundary logic of at least one partition of a plurality of partitions in an integrated circuit (IC) design in response to connectivity and timing constraints of the IC design;
marking the boundary logic of the at least one partition for design operations based on at least one predetermined criterion such that unmarked portions of the at least one partition are ignored during design operations of the IC design to save processing time; and
performing implementation of the IC design in response to the marking of the boundary logic.

21. The system of claim 20, wherein the deriving of the boundary logic of the at least one partition includes
identifying the boundary logic in a corresponding partition based on connectivity of a plurality of objects within the corresponding partition and at least one timing constraint.

22. The system of claim 21, wherein the deriving of the boundary logic of the at least one partition of the plurality of partitions further includes
applying the at least one timing constraint on the IC design;
propagating the at least one timing constraint into the corresponding partition; and
tracing a timing pass into the corresponding partition based on the at least one timing constraint.

23. The system of claim 20, wherein the marking of the boundary logic of the at least one partition includes
marking the boundary logic in different levels based on timing of the boundary logic of a corresponding partition.

24. The system of claim 20, wherein the marking of the boundary logic of the at least one partition includes
marking the boundary logic based on a type of objects within a corresponding partition.

25. The system of claim 24, wherein the marking of the boundary logic based on the type of objects within the corresponding partition includes
marking the boundary logic of the corresponding partition if the corresponding partition includes at least one synchronous object.

26. The system of claim 20, wherein
the marking of the boundary logic forms marked boundary logic, and
the performing of the implementation of the IC design in response to the marking of the boundary logic includes
performing timing-driven placement of the IC design with the marked boundary logic;
routing the IC design with the marked boundary logic;
performing timing analysis on the IC design with the marked boundary logic; and
optimizing the IC design with the marked boundary logic after the performing of the timing-driven placement.

27. The system of claim 20, wherein the operations further includes
cutting the IC design into a plurality of blocks after the performing of the implementation of the IC design in response to the marking of the boundary logic.

28. A machine-readable medium that includes instructions that, when executed, will perform operations comprising:
identifying boundary logic in at least one partition of an integrated circuit (IC) design based on connectivity of a plurality of objects within the at least one partition and at least one timing constraint; and
marking at least part of the identified boundary logic for design operations based on at least one predetermined criterion without removing the rest of the identified boundary logic and internal logic of the at least one partition such that unmarked portions of the at least one partition are ignored during design operations of the IC design to save processing time.

29. The machine-readable medium of claim 28, wherein
the marking of at least part of the identified boundary logic forms marked boundary logic, and
the operations further include
performing timing-driven placement of the IC design with the marked boundary logic;
routing the IC design with the marked boundary logic;
performing timing analysis of the IC design with the marked boundary logic; and
optimizing the IC design with the marked boundary logic.

30. The machine-readable medium of claim 28, wherein the operations further include
applying the at least one timing constraint on the IC design;
propagating the at least one timing constraint into a corresponding partition; and
tracing a timing pass into the at least one partition based on the at least one timing constraint.

31. The machine-readable medium of claim 28, wherein the marking of the at least part of the identified boundary logic based on at least one predetermined criterion includes
marking at least part of the identified boundary logic in different levels based on timing of the identified boundary logic.

32. A machine-readable medium that includes instructions that, when executed, will perform operations comprising:
marking at least part of boundary logic of at least one partition in an integrated circuit (IC) design for design operations based on at least one predetermined criterion such that unmarked portions of the at least one partition are ignored during design operations of the IC design to save processing time; and
performing implementation of the IC design in response to the marking of the at least part of the boundary logic to form marked boundary logic, wherein the implementation includes timing-driven placement of the IC design with the marked boundary logic, routing the IC design with the marked boundary logic, timing analysis of the IC design with the marked boundary logic, and optimization of the IC design with the marked boundary logic.

33. The machine-readable medium of claim 32, wherein the operations further include
deriving the boundary logic in the at least one partition based on connectivity of a plurality of objects within the at least one partition and at least one timing constraint.

34. The machine-readable medium of claim 33, wherein the operations further include
applying the at least one timing constraint on the IC design;
propagating the at least one timing constraint into the at least one partition; and
tracing a timing pass into the at least one partition based on the at least one timing constraint.

35. The machine-readable medium of claim 32, wherein the marking of the at least part of the boundary logic of the at least one partition based on at least one predetermined criterion includes
marking at least part of the boundary logic if the at least one partition includes at least one synchronous object.

* * * * *